United States Patent
Chuang et al.

(10) Patent No.: US 7,612,364 B2
(45) Date of Patent: Nov. 3, 2009

(54) MOS DEVICES WITH SOURCE/DRAIN REGIONS HAVING STRESSED REGIONS AND NON-STRESSED REGIONS

(75) Inventors: Harry Chuang, Austin, TX (US);
Kong-Beng Thei, Hsin-Chu (TW);
Yuan-Chen Sun, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 57 days.

(21) Appl. No.: 11/602,100

(22) Filed: Nov. 20, 2006

(65) Prior Publication Data
US 2008/0054250 A1    Mar. 6, 2008

Related U.S. Application Data

(60) Provisional application No. 60/841,008, filed on Aug. 30, 2006.

(51) Int. Cl.
*H01L 29/06* (2006.01)

(52) U.S. Cl. ............................... 257/19; 257/18; 257/63; 257/65; 257/190; 257/192; 257/E29.104; 257/E29.193; 257/E31.035; 257/E33.009

(58) Field of Classification Search ................ 257/19, 257/18, 63, 65, 190, 192, E29.104, E29.193, 257/E31.035, E33.009
See application file for complete search history.

(56) References Cited

U.S. PATENT DOCUMENTS

| | | | |
|---|---|---|---|
| 6,124,627 A | | 9/2000 | Rodder et al. |
| 6,274,894 B1 * | | 8/2001 | Wieczorek et al. ........... 257/192 |
| 6,794,713 B2 | | 9/2004 | Mizushima et al. |
| 7,226,820 B2 * | | 6/2007 | Zhang et al. ................. 438/149 |
| 7,253,067 B2 * | | 8/2007 | Abe ............................ 438/306 |
| 7,381,604 B2 | | 6/2008 | Lin et al. |
| 2005/0184345 A1 * | | 8/2005 | Lin et al. ..................... 257/375 |
| 2006/0289856 A1 * | | 12/2006 | Shimamune et al. .......... 257/19 |
| 2007/0001162 A1 * | | 1/2007 | Orlowski et al. .............. 257/19 |
| 2007/0020864 A1 * | | 1/2007 | Chong et al. ................. 438/300 |
| 2007/0173022 A1 * | | 7/2007 | Wang et al. .................. 438/272 |

FOREIGN PATENT DOCUMENTS

CN         1725506 A         1/2006

* cited by examiner

*Primary Examiner*—Andy Huynh
(74) *Attorney, Agent, or Firm*—Slater & Matsil, L.L.P.

(57) ABSTRACT

A semiconductor structure includes a semiconductor substrate; a gate stack on the semiconductor substrate; a stressor having at least a portion in the semiconductor substrate and adjacent to the gate stack, wherein the stressor comprises an impurity of a first conductivity type; and a portion of the semiconductor substrate adjoining the stressor and on an opposite side of the stressor from the gate stack, wherein the portion of the semiconductor substrate is doped with an impurity of the first conductivity type.

14 Claims, 9 Drawing Sheets

MOS DEVICES WITH SOURCE/DRAIN REGIONS HAVING STRESSED REGIONS AND NON-STRESSED REGIONS

This application claims the benefit of the following provisionally filed U.S. Patent application: Application Ser. No. 60/841,008, filed Aug. 30, 2006, entitled "Structure and Methods for Forming SiGe Stressors;" which patent application is incorporated herein by reference.

TECHNICAL FIELD

This invention relates generally to semiconductor devices, and more particularly to structures and formation methods for metal-oxide-semiconductor (MOS) devices with stressors.

BACKGROUND

Reductions in the size of semiconductor devices (e.g., a metal-oxide semiconductor device) have enabled continued improvement in speed, performance, density, and cost per unit function of integrated circuits over the past few decades. In accordance with the design of a transistor and one of the inherent characteristics thereof, modulating the length of a channel region underlying a gate between a source and a drain of the transistor alters a resistance associated with the channel region, thereby affecting the performance of the transistor. More specifically, shortening the length of the channel region reduces a source-to-drain resistance of the transistor, which, assuming other parameters are maintained relatively constant, may allow for an increase in current flow between the source and drain when a sufficient voltage is applied to the gate of the transistor.

To further enhance the performance of MOS devices, stress may be introduced in the channel region of a MOS transistor to improve carrier mobility. Generally, it is desirable to induce a tensile stress in the channel region of an n-type metal-oxide-semiconductor (NMOS) device in a source-to-drain direction and to induce a compressive stress in the channel region of a p-type metal-oxide-semiconductor (PMOS) device in a source-to-drain direction.

A commonly used method for applying compressive stresses to the channel regions of PMOS devices is to grow SiGe stressors in the source and drain regions. Such a method typically includes forming a gate stack on a semiconductor substrate; forming gate spacers on sidewalls of the gate stack; forming recesses in the silicon substrate; and epitaxially growing SiGe stressors in the recesses. Since SiGe has a greater lattice constant than silicon, it applies a compressive stress to the channel region, which is located between a source SiGe stressor and a drain SiGe stressor. Similarly, SiC stressors may be formed for NMOS devices. Since SiC has a smaller lattice constant than silicon, tensile stresses may be applied to the channel regions.

Conventional stressor formation processes suffer drawbacks, however. FIG. 1 illustrates PMOS devices formed using conventional stressor formation processes. PMOS devices 2, 4 and 6 are serially connected, and SiGe stressors 8, 10, 12 and 14 are formed. SiGe stressors 8 and 14 have greater areas than SiGe stressors 10 and 12. Due to pattern-loading effects, the thicknesses of SiGe stressors 8, 10, 12 and 14 are not uniform. Particularly, SiGe stressors 8 and 14 tend to have central portions 16, which are significantly thinner than the respective edge portions. The thickness variation causes drive current degradation and thus is an undesired phenomenon.

In addition, in conventional SiGe formation processes, silicide regions on SiGe stressors are adversely affected. FIG. 2 illustrates a SiGe stressor 18 formed adjacent an N+ region 20. A silicide film 22 is formed on SiGe stressor 18 and N+ region 20 to improve contact. It has been found that in region 24, proximate an interface between SiGe stressor 18 and N+ region 20, the thickness of silicide film 22 is significantly less than in other regions.

Conventionally, to avoid the above-discussed problems, special design rules have to be followed. For example, the sizes of active regions, which include SiGe stressors, have to be limited in order to reduce pattern-loading effects. These special design rules significantly limit the flexibility of circuit design. Improved formation methods are thus needed.

SUMMARY OF THE INVENTION

In accordance with one aspect of the present invention, a semiconductor structure includes a semiconductor substrate; a gate stack on the semiconductor substrate; a stressor having at least a portion in the semiconductor substrate and adjacent to the gate stack, wherein the stressor comprises an impurity of a first conductivity type; and a portion of the semiconductor substrate adjoining the stressor and on an opposite side of the stressor from the gate stack, wherein the portion of the semiconductor substrate is doped with an impurity of the first conductivity type.

In accordance with yet another aspect of the present invention, a semiconductor structure includes a first metal-oxide-semiconductor (MOS) device and a second MOS device. The first MOS device includes a first gate stack on the semiconductor substrate; a first stressor having at least a portion in the semiconductor substrate and adjacent to the first gate stack, wherein the first stressor comprises an impurity of a first conductivity type; and a first portion of the semiconductor substrate adjoining the first stressor and on an opposite side of the first stressor from the first gate stack, wherein the first portion of the semiconductor substrate is doped with an impurity of the first conductivity type. The second MOS device includes a second gate stack on the semiconductor substrate; a second stressor having at least a portion in the semiconductor substrate and adjacent to the second gate stack, wherein the second stressor comprises an impurity of the first conductivity type; and a second portion of the semiconductor substrate adjoining the second stressor and on an opposite side of the second stressor from the second gate stack, wherein the second portion of the semiconductor substrate is doped with an impurity of the first conductivity type. The semiconductor structure further includes a third portion of the semiconductor substrate between and adjoining the first and the second portions of the semiconductor substrate.

By limiting the areas of the stressors of MOS devices, the pattern-loading effects of the formation processes of the stressors are reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
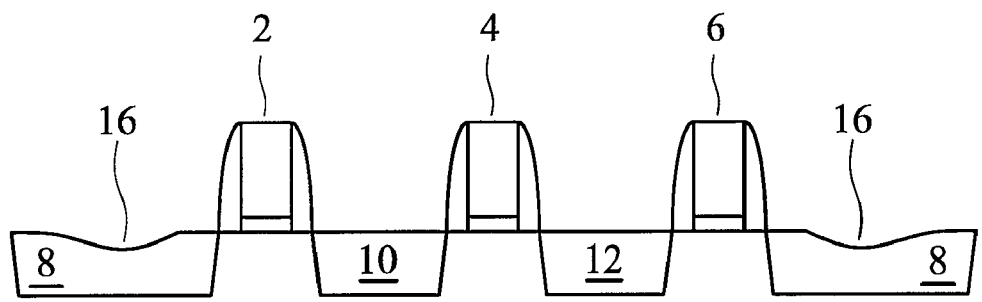
FIG. 1 illustrates a conventional semiconductor structure, wherein SiGe stressors having great areas have recesses.
Figure 2:
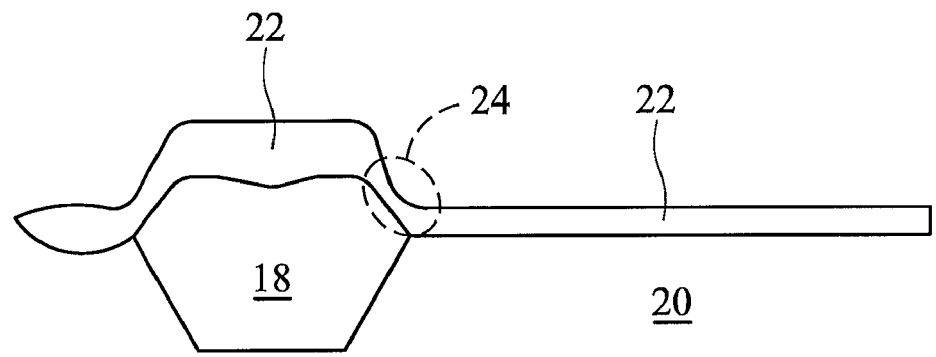
FIG. 2 illustrates a conventional semiconductor structure, wherein a silicide film on an interface of a SiGe stressor and an N+ region has a small thickness.
Figure 3:
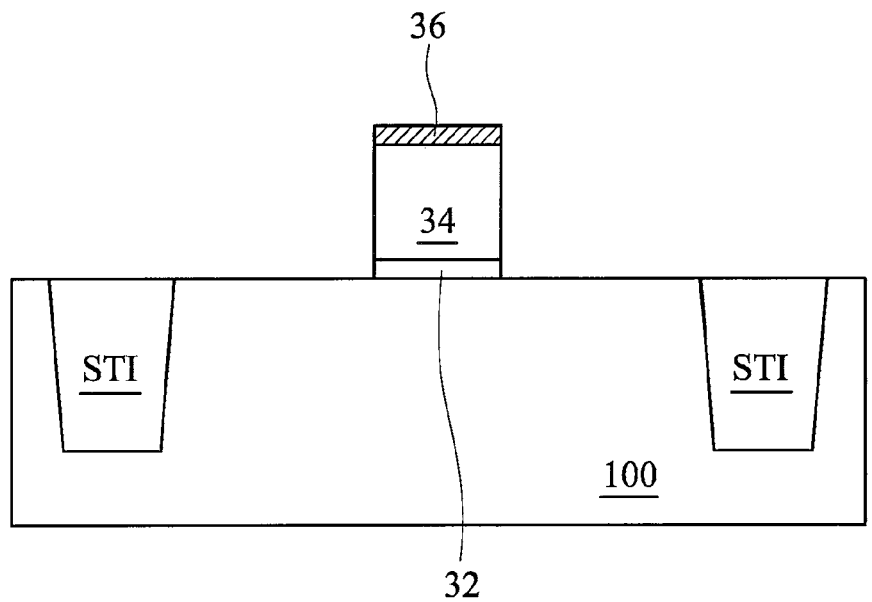
FIGS. 3-5B and 7-10 are illustrations of intermediate stages in the manufacturing of a first embodiment of the present invention.

FIGS. 3-5 and 7-10 illustrate intermediate stages in the manufacturing of a first embodiment of the present invention. FIG. 3 illustrates a gate stack formed on a substrate 100, which preferably comprises bulk silicon, although other commonly used materials and structures such as silicon-on-insulator (SOI) can be used. Alternatively, a SiGe substrate with a low germanium-to-silicon ratio may be used. Shallow trench isolation (STI) regions are formed to isolate active regions. The gate stack includes a gate electrode 34 on a gate dielectric 32, and a hard mask 36 on gate electrode 34. Hard mask 36 may be formed of materials such as oxides, silicon nitrides, silicon oxynitrides, and combinations thereof. As is known in the art, gate dielectric 32 may be formed of commonly used dielectric materials such as oxides, nitrides, oxynitrides, oxycarbides, carbonitrides, combinations thereof, and multi-layers thereof. Gate electrode 34 may comprise commonly used conductive materials, such as doped polysilicon, metals, metal silicides, metal nitrides, and the like.

Figure 4:
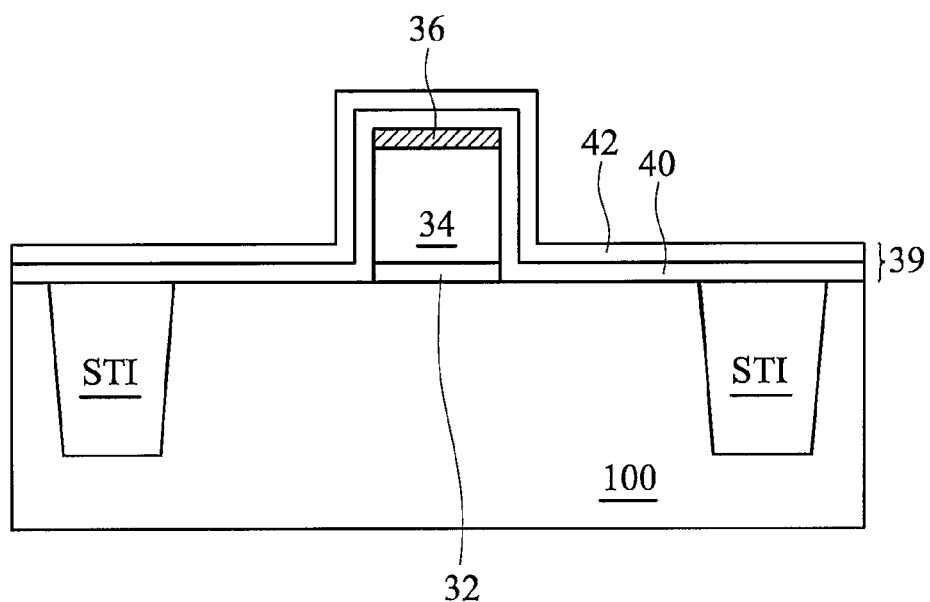

A dummy layer 39 is blanket formed, as shown in FIG. 4. In the preferred embodiment, dummy layer 39 includes a liner oxide layer 40 and a nitride layer 42. In alternative embodiments, dummy layer 39 includes a single layer, which preferably comprises oxide, silicon nitride, silicon oxynitride (SiON), and/or other dielectric materials.

Figure 5A:
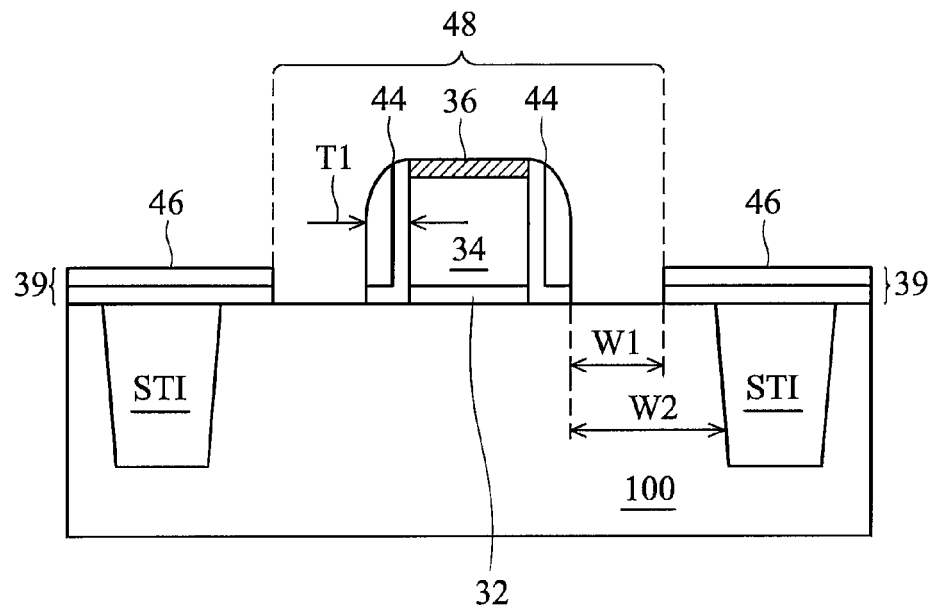

Referring to FIG. 5A, dummy layer 39 is patterned to form dummy spacers 44. Preferably, some of the horizontal portions of dummy layer 39 are removed. The remaining portions of dummy layer 39 form dummy spacers 44 and portions 46. It is noted that only horizontal portions of dummy layer 39 in a region 48 are removed. The remaining dummy layer 39 is used as a mask for the subsequent formation of SiGe stressors. Therefore, portions of active regions that are outside of region 48 are protected by the remaining dummy layer 39.

The dimension of regions 48 is preferably determined in such a way that, across the semiconductor chip, the pattern densities of subsequently formed SiGe stressors are as uniform as possible. Referring to FIG. 5A, width W1 is the width of the removed portions of dummy layer 39. Width W2 is the distance between an outer edge of the SiGe stressor to the respective edge of the ST1. Width W2 is used as one of the criteria for determining whether the embodiments of the present invention should be applied or not. In an exemplary embodiment, such as 65 nm technology, the preferred maximum width W1 of the removed portions of dummy layer 39, which will be used for forming SiGe stressors, is less than about 0.5 µm. If width W2 is larger than 0.5 µm, width W1 is limited within 0.5 µm. If the width W2 is less than 0.5 µm, width W1 may be equal to or less than width W2. Accordingly, the widths W1 for all PMOS devices in a wafer are limited in a small range.

Figure 5B:
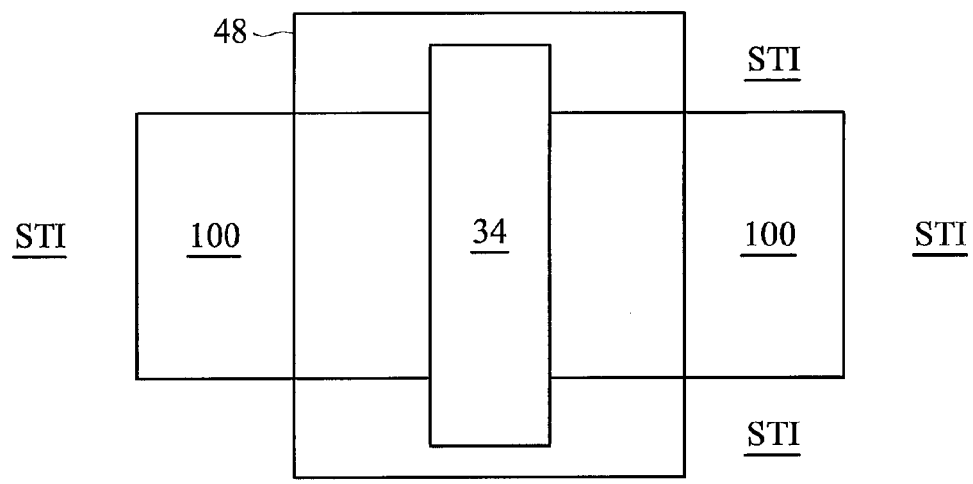
Figure 6:
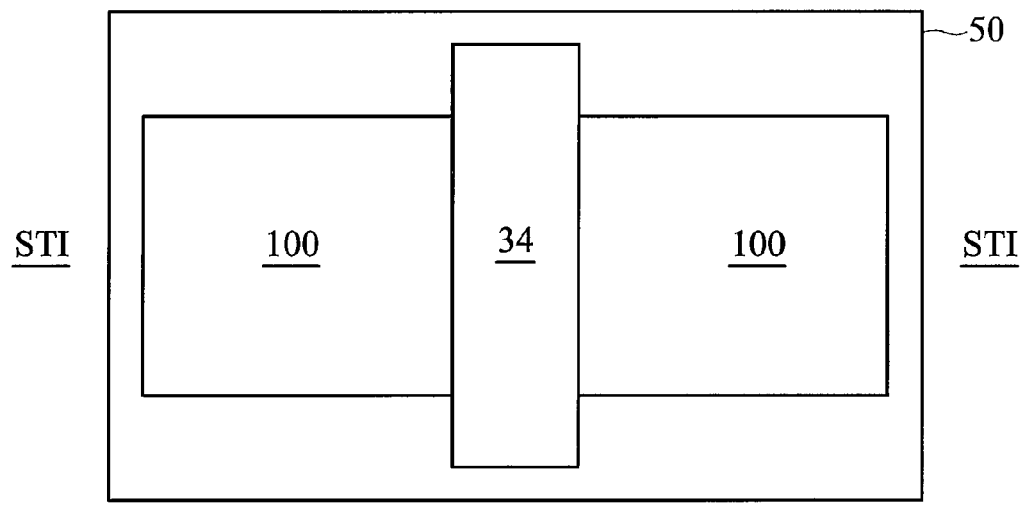
FIG. 6 illustrates a conventional mask for forming SiGe stressors.

FIG. 5B illustrates a top view of the structure shown in FIG. 5A, wherein an active region in substrate 100 is surrounded by STI region(s). Gate electrode 34 is formed over the active region. Dummy layer 39 covers the entire illustrated region except region 48. As a comparison, FIG. 6 illustrates a top view of a conventional structure, wherein the horizontal portions of dummy layer 39 are removed from a region 50, which covers the entire active region in substrate 100, and possibly extends over the STI regions. It is noted that region 50 is greater than region 48.

Referring back to FIG. 5B, the boundary of region 48 is defined by a mask. In the preferred embodiment, the mask may be formed by applying logic operations (LOP) and/or optical proximity corrections (OPC) to a conventional mask used for patterning the structure shown in FIG. 6. Through LOP and/or OPC, the boundary of the mask may be revised as required.

Figure 7:
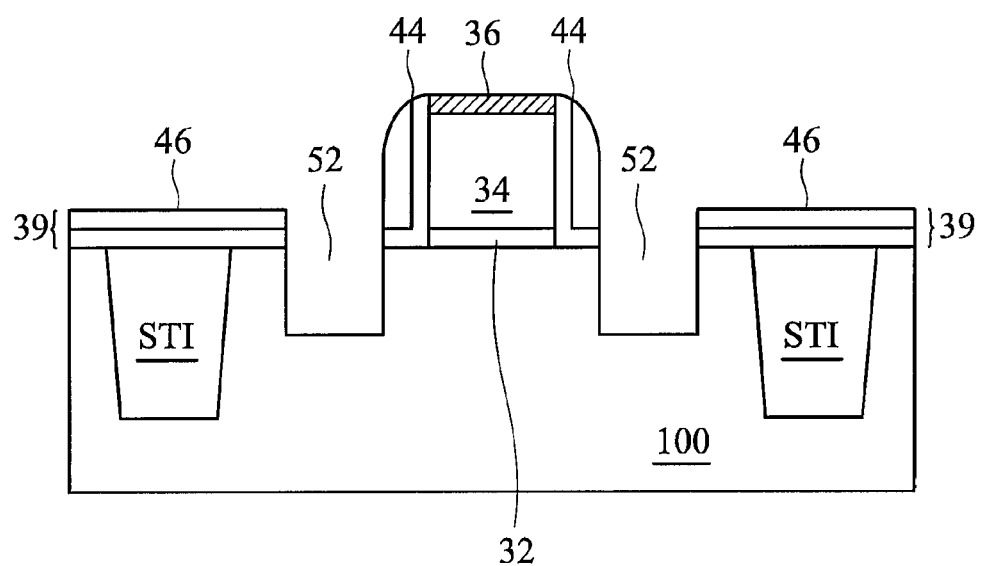
Figure 8:
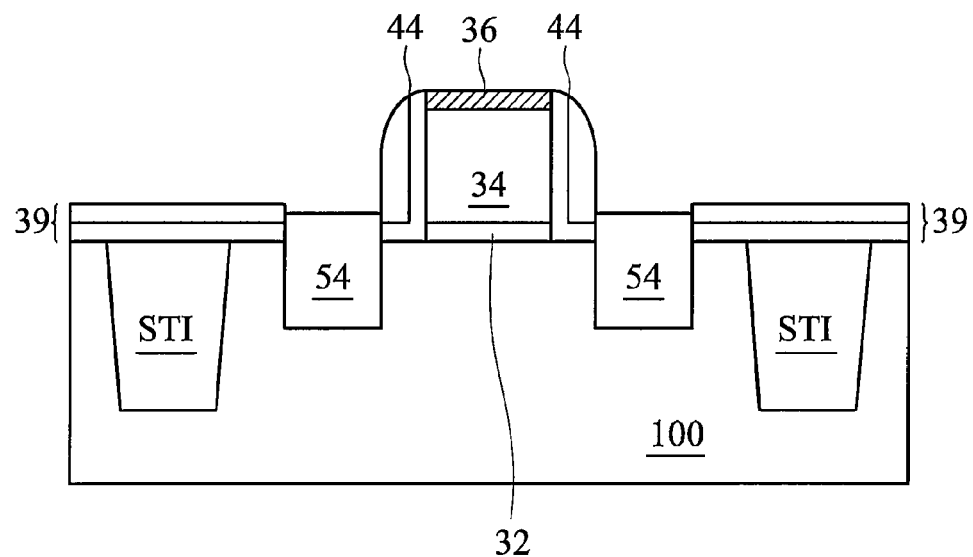

Recesses 52 are then formed in substrate 100 along the edges of dummy spacers 44, preferably anisotropically, as illustrated in FIG. 7. FIG. 8 illustrates the formation of epitaxy regions 54. As is known in the art, a semiconductor material, preferably SiGe, may be epitaxially grown in recesses 52 by selective epitaxial growth (SEG), forming epitaxy regions 54. The semiconductor material preferably has a lattice constant greater than the lattice constant of substrate 100. Desired impurities may or may not be doped while the epitaxial growth proceeds. Throughout the description, epitaxy regions 54 are alternatively referred to as SiGe stressors 54.

Figure 9:
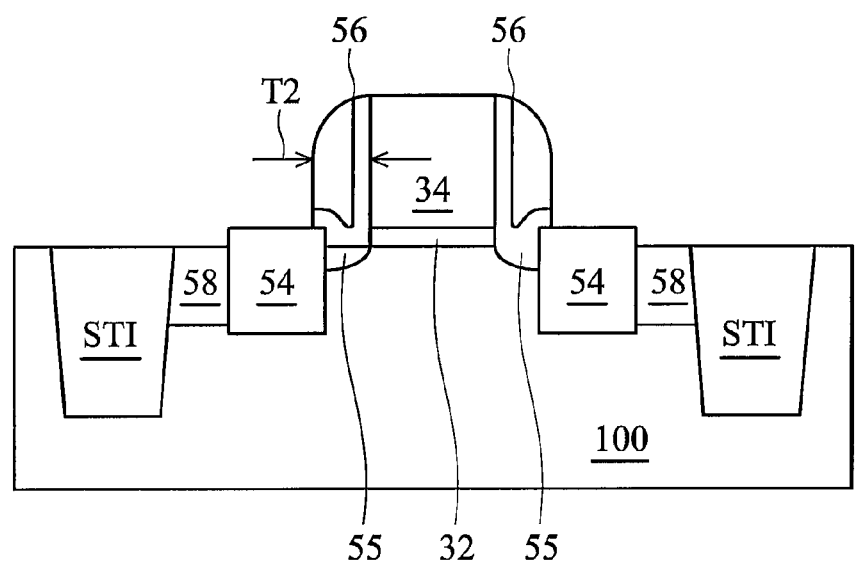

Referring to FIG. 9, dummy spacers 44, portion 46 and hard mask 36 are removed. In an exemplary embodiment, the silicon nitride portions of spacers 44, portion 46 and hard mask 36 are removed by etching in phosphoric acid, and the liner oxide portions in dummy spacers 44 and portion 46 are stripped using diluted hydrofluoric acid. Lightly doped source/drain (LDD) regions 55 and pocket/halo regions (not shown) are then formed. The formation processes for LDD regions 55 and pocket/halo regions are well known in the art, and thus are not repeated herein.

Spacers 56 are then formed. Preferably, a liner oxide layer and a nitride layer are blanket formed. The two layers are then patterned to form spacers 56. Spacers 56 preferably have a thickness T2 greater than a thickness T1 of dummy spacers 44 (refer to FIG. 5A), although thickness T2 may be equal to or smaller than thickness T1. Deep source/drain regions (not shown) are then formed, preferably by implanting p-type impurities such boron and/or indium. The deep source/drain regions include P+ regions 58 and at least portions of SiGe regions 54, wherein P+ regions 58 are doped portions of substrate 100.

Figure 10:
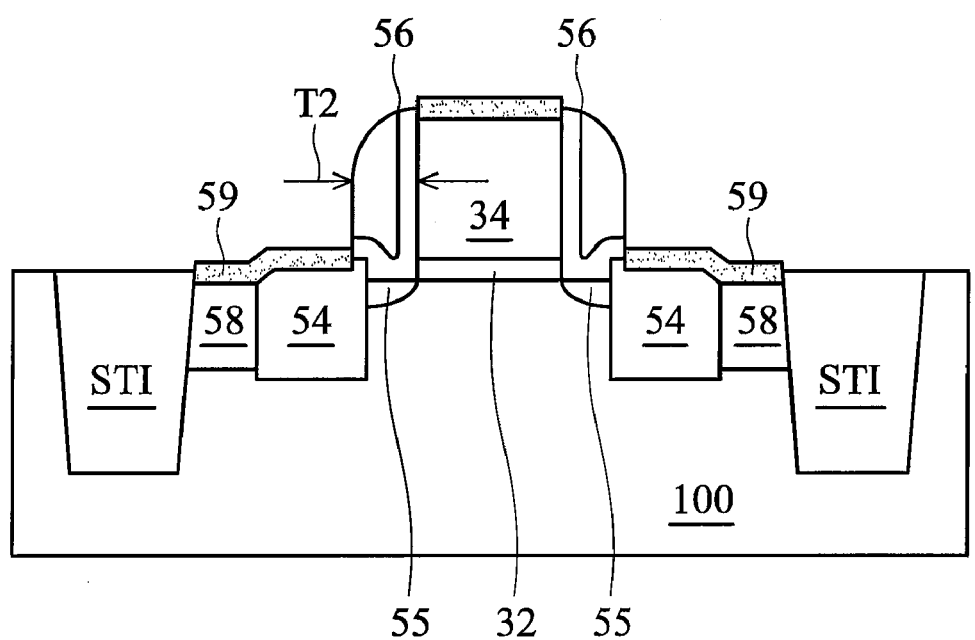

FIG. 10 illustrates the formation of suicide regions 59. As is known in the art, suicide regions may be formed by blanket forming a metal layer, annealing the wafer to cause a reaction between the metal layer and the underlying silicon or SiGe, and removing un-reacted metal layer so that suicide or germanium-silicide remains. Please note that on same substrate 100, additional MOS devices similar to the device shown in FIG. 10 may be formed, except P+ regions 58 are not formed in the additional MOS devices, and SiGe stressors 54 adjoin the respective STI regions. In this case, the SiGe stressors of the additional MOS devices may have widths equal to or greater than the width of the SiGe stressors 54 shown in FIG. 10.

The previously discussed embodiment illustrates SiGe stressor formation by using dummy spacers 44. Alternatively, SiGe stressors may be formed without forming dummy spacers. In an exemplary embodiment, the formation process includes forming a gate stack; forming LDD regions and halo/pocket regions; forming gate spacers, recessing the substrate to form recesses, wherein the recesses have smaller areas than the available active regions in order to reduce pattern-loading effects; growing SiGe stressors in the recesses; implanting SiGe stressors, wherein exposed active regions adjoining the SiGe stressors are also implanted optionally; and forming silicide regions on the source/drain regions and the gate electrode.

Figure 11A:
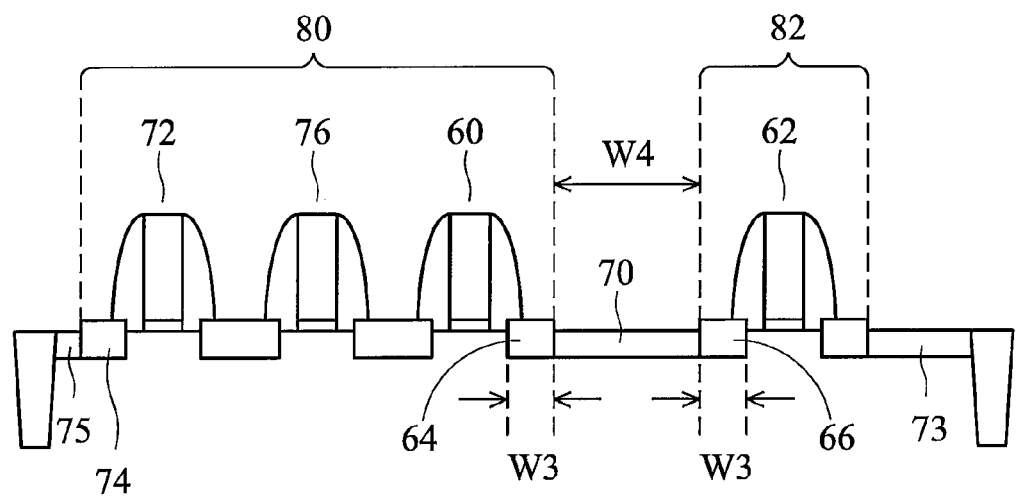
FIGS. 11A and 11B illustrate a second embodiment of the present invention, wherein MOS devices with stressors are separated by a P+ region.
Figure 11B:
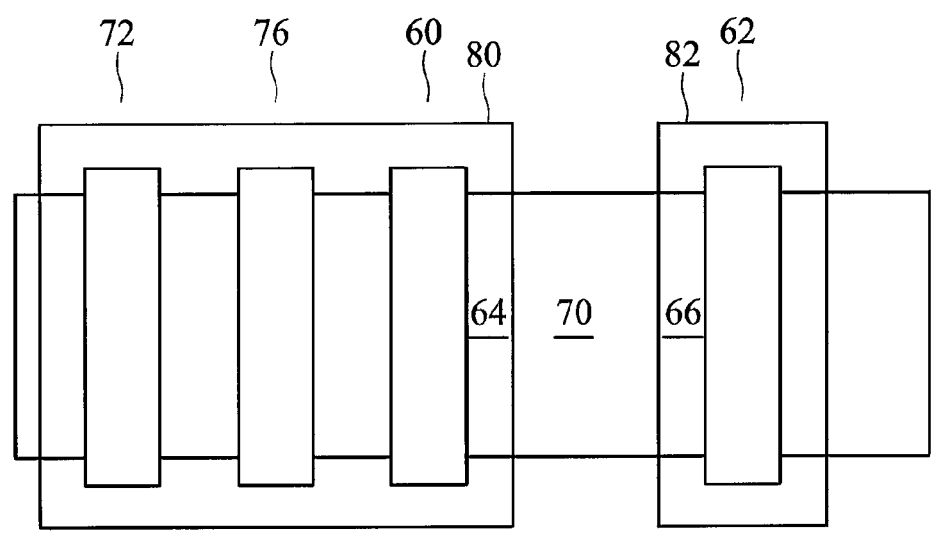

FIGS. 11A and 11B illustrate a second embodiment of the present invention. A first PMOS device 60 and a second PMOS device 62 are spaced apart by a P+ region 70, which may have a same or a different impurity concentration than implanted regions 73 and 75. PMOS device 60 comprises a SiGe region 64, and PMOS device 62 comprises a SiGe region 66. The mask used for forming the structure shown in FIG. 11A is illustrated in FIG. 11B, which includes a region 80 and a region 82. SiGe stressors are formed only in regions 80 and 82. Referring to FIG. 11A, width W3 is the width of SiGe stressors 64 and 66. Width W4 is the width of P+ region 70. In the preferred embodiment of this invention, a ratio of width W3 to width W4 is preferably equal to or less than about 0.5. Similarly, the mask for defining boundaries of regions 80 and 82 may be revised from an existing mask using logic operation and/or optical proximity correctness. As a comparison, if the existing mask is used, SiGe stressors will likely be formed in a region including regions 80, 82 and 70. Preferably, after the formation of SiGe regions, P+ regions 70, and implant regions 73 and 75 are formed by implanting a p-type impurity.

PMOS devices 60, 76 and 72 are serially connected, and thus the SiGe stressors between the PMOS devices have relatively small areas. By limiting the areas of SiGe regions 64, 66 and 74, the pattern densities of the SiGe stressors are evened out, and thus the variation in thickness is reduced.

Figure 12A:
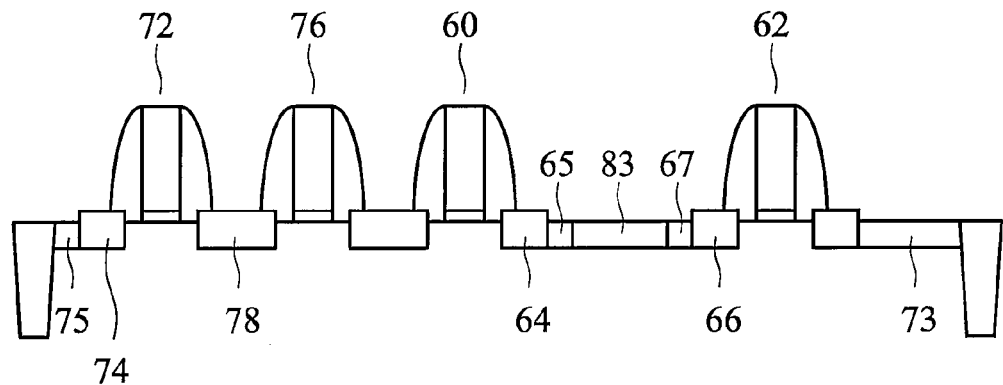
FIGS. 12A and 12B illustrate a third embodiment of the present invention, wherein MOS devices with stressors are separated by an N+ region.
Figure 12B:
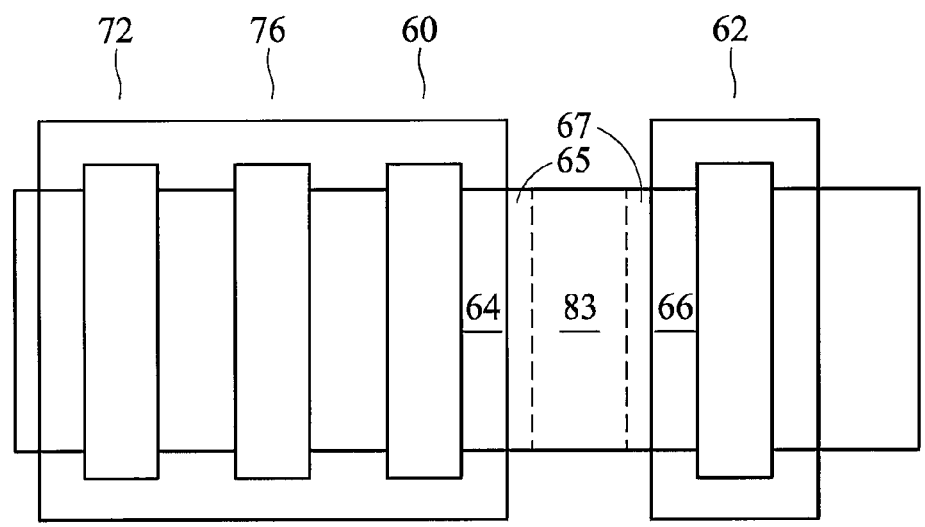

FIGS. 12A and 12B illustrate a cross-sectional view and a top view of a third embodiment of the present invention, respectively. This embodiment is similar to the embodiment shown in FIGS. 11A and 11B, except an N+ region 83 is formed between two P+ regions 65 and 67. N+ region 83 may be a pickup region of the underlying N-well region, or an active region of an NMOS device (not shown). P+ regions 65 and 67 may be formed by the implantation of p-type deep source/drain regions.

Figure 13:
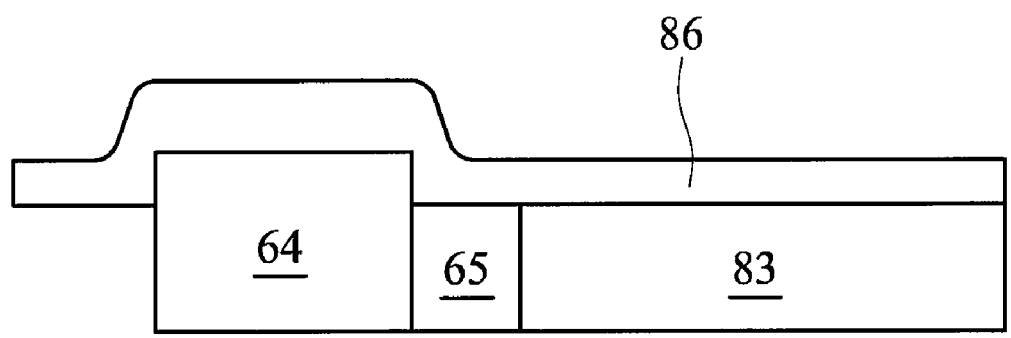
FIG. 13 illustrates a semiconductor structure, wherein a silicide film on an interface region of a SiGe stressor and an N+ region has an increased thickness.

FIG. 13 illustrates a portion of the structure shown in FIGS. 12A and 12B, wherein the portion includes SiGe region 64, P+ region 65 and N+ region 83, with a silicide film 84 formed thereon. It is found that silicide region 86, which is over an interface portion of SiGe region 64 and neighboring P+ region 65, has a comparable thickness with other silicide regions. A possible reason is that in the embodiments of the present invention, SiGe stressor 64, which is of p-type, now adjoins a p-type region instead of an n-type region as in conventional structures, and a same impurity type on both sides of the interface portion helps to improve uniformity of the overlying silicide region.

The concept of the preferred embodiments of the present invention may be used for the formation of NMOS devices, which includes SiC stressors for applying a tensile stress to the respective channel regions. The structures are similar to those illustrated in FIGS. 10, 11A and 12A, except that the types of implanted regions are inverted and SiGe regions are replaced by SiC regions. Similar to the embodiments discussed in the preceding paragraphs, the formation process preferably includes forming recesses in the substrate, wherein the recesses have smaller areas than the available active region. Preferably, N+ regions are formed adjoining the SiC stressors. With smaller areas for the SiC stressors, the pattern-loading effects are reduced, and the thickness variations of the SiC stressors are also reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a semiconductor substrate;
   a gate stack on the semiconductor substrate;
   a source region comprising:
       a first stressor having at least a portion in the semiconductor substrate and adjacent to the gate stack;
       a first portion of the semiconductor substrate adjoining the first stressor and on an opposite side of the first stressor from the gate stack; and
   a drain region comprising:
       a second stressor having at least a portion in the semiconductor substrate and on an opposite side of the gate stack than the first stressor; and
       a second portion of the semiconductor substrate adjoining the second stressor and on an opposite side of the second stressor from the gate stack, wherein the first and the second stressors and the first and the second portions of the semiconductor substrate are doped with impurities of a same conductivity type.

2. The semiconductor structure of claim 1 further comprising a first insulation region in the semiconductor substrate and adjoining the first portion of the semiconductor substrate.

3. The semiconductor structure of claim 2 further comprising a second insulation region in the semiconductor substrate and adjoining the second portion of the semiconductor substrate.

4. The semiconductor structure of claim 1, wherein the conductivity type is p-type, and wherein the first stressor comprises SiGe.

5. The semiconductor structure of claim 1, wherein the conductivity type is n-type, and wherein the first stressor comprises SiC.

6. The semiconductor structure of claim 1 further comprising a silicide film on the first stressor and the first portion of the semiconductor substrate.

7. A semiconductor structure comprising:
a semiconductor substrate;
a first metal-oxide-semiconductor (MOS) device comprising:
  a first gate stack on the semiconductor substrate;
  a first stressor having at least a portion in the semiconductor substrate and adjacent to the first gate stack, wherein the first stressor comprises an impurity of a first conductivity type; and
  a first portion of the semiconductor substrate adjoining the first stressor and on an opposite side of the first stressor from the first gate stack, wherein the first portion of the semiconductor substrate is doped with an impurity of the first conductivity type; and
a second MOS device comprising:
  a second gate stack on the semiconductor substrate;
  a second stressor having at least a portion in the semiconductor substrate and adjacent to the second gate stack, wherein the second stressor comprises an impurity of the first conductivity type; and
  a second portion of the semiconductor substrate adjoining the second stressor and on an opposite side of the second stressor from the second gate stack, wherein the second portion of the semiconductor substrate is doped with an impurity of the first conductivity type; and
  a third portion of the semiconductor substrate between and adjoining the first and the second portions of the semiconductor substrate.

8. The semiconductor structure of claim 7, wherein the third portion of the semiconductor substrate comprises an impurity of the first conductivity type.

9. The semiconductor structure of claim 7, wherein the third portion of the semiconductor substrate comprises an impurity of a second conductivity type opposite the first conductivity type.

10. The semiconductor structure of claim 7 further comprising a silicide film on the first stressor and the first portion of the semiconductor substrate.

11. The semiconductor structure of claim 7, wherein the first conductivity type is p-type, and wherein the first and the second stressors comprise SiGe.

12. The semiconductor structure of claim 7, wherein the first conductivity type is n-type, and wherein the first and the second stressors comprise SiC.

13. The semiconductor structure of claim 7, wherein the first MOS device further comprises:
  a third stressor having at least a portion in the semiconductor substrate and on an opposite side of the first gate stack from the first stressor, wherein the third stressor comprises an impurity of the first conductivity type; and
  an insulation region in the semiconductor substrate and spaced apart from the third stressor by a fourth portion of the semiconductor substrate, wherein the fourth portion of the semiconductor substrate is doped with an impurity of the first conductivity type.

14. The semiconductor structure of claim 7, wherein a first width of the first stressor and a third width of the third portion of the semiconductor substrate have a first ratio, and wherein a second width of the second stressor and the third width have a second ratio, and wherein each of the first and the second ratios is less than about 0.5.

* * * * *